United States Patent
Sinha et al.

(10) Patent No.: US 11,348,875 B2
(45) Date of Patent: May 31, 2022

(54) SEMICONDUCTOR DEVICES WITH FLEXIBLE CONNECTOR ARRAY

(71) Applicant: Micron Technology, Inc., Boise, ID (US)

(72) Inventors: Koustav Sinha, Boise, ID (US); Xiaopeng Qu, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/803,954

(22) Filed: Feb. 27, 2020

(65) Prior Publication Data

US 2021/0272908 A1    Sep. 2, 2021

(51) Int. Cl.
| | |
|---|---|
| *H01L 23/538* | (2006.01) |
| *H05K 1/18* | (2006.01) |
| *H01L 23/498* | (2006.01) |
| *H01L 23/00* | (2006.01) |

(52) U.S. Cl.
CPC ...... *H01L 23/5387* (2013.01); *H01L 23/4985* (2013.01); *H01L 24/48* (2013.01); *H05K 1/189* (2013.01)

(58) Field of Classification Search
CPC .................................................. H01L 23/5387
USPC ........................................................ 257/734
See application file for complete search history.

(56) References Cited

U.S. PATENT DOCUMENTS

| | | | | |
|---|---|---|---|---|
| 6,727,579 B1* | 4/2004 | Eldridge | ............. | H05K 3/4015 257/692 |
| 2002/0195707 A1* | 12/2002 | Bernier | .................. | H01L 24/81 257/738 |
| 2007/0228549 A1* | 10/2007 | Hsu | ..................... | H01L 21/4853 257/698 |
| 2018/0374813 A1* | 12/2018 | Khazaka | ............. | H01L 21/4846 |

FOREIGN PATENT DOCUMENTS

WO    WO-2019126435 A1 *    6/2019    ............. H05K 3/321

* cited by examiner

*Primary Examiner* — Ajay Arora
(74) *Attorney, Agent, or Firm* — Perkins Coie LLP (57) ABSTRACT

Semiconductor devices having an array of flexible connectors configured to mitigate thermomechanical stresses, and associated systems and methods, are disclosed herein. In one embodiment, a semiconductor assembly includes a substrate coupled to an array of flexible connectors. Each flexible connector can be transformed between a resting configuration and a loaded configuration. Each flexible connector can include a conductive wire electrically coupled to the substrate and a support material at least partially surrounding the conductive wire. The conductive wire can have a first shape when the flexible connector is in the resting configuration and a second, different shape when the flexible connector is in the loaded configuration.

22 Claims, 8 Drawing Sheets

FIG. 6

SEMICONDUCTOR DEVICES WITH FLEXIBLE CONNECTOR ARRAY

TECHNICAL FIELD

The present technology generally relates to semiconductor devices, and more particularly relates to semiconductor devices having an array of flexible connectors configured to mitigate thermomechanical stresses.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

In some semiconductor assemblies, a packaged semiconductor die can be electrically coupled to a printed circuit board (PCB) via solder bumps arranged in a ball grid array (BGA). However, cyclic heating and/or cooling of the semiconductor package can induce significant thermomechanical stress between the semiconductor package and the PCB due to a mismatch in the coefficients of thermal expansion of these components. Often, the stress can induce cracking of the semiconductor package at or near the solder joints, which can render the semiconductor package inoperable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In several of the embodiments described below, a semiconductor assembly configured in accordance with the present technology can include a substrate coupled to a PCB via an array of flexible connectors. Each flexible connector can be transformed between a resting configuration and at least one loaded configuration (e.g., a compressed configuration and/or a stretched configuration). In some embodiments, each flexible connector includes a conductive element (e.g., a conductive wire) electrically coupled to the substrate and a support material at least partially surrounding the conductive element. The conductive element can have a first shape when the flexible connector is in the resting configuration and a second, different shape when the flexible connector is in the loaded configuration. The support material can deform as the flexible connector moves between the resting configuration and the loaded configuration. As a result, when the assembly is subjected to thermomechanical stress, the flexible connectors can compress and/or stretch without cracking or fracturing. The flexible connector arrays of the present technology are expected to improve the reliability and robustness of semiconductor devices, particularly in applications involving temperature and/or power cycling or other harsh field usage conditions such as automotive applications.

Although certain embodiments herein are described with respect to flexible connectors for coupling a package substrate to a PCB, the present technology can also be used to couple other components of a semiconductor device to each other, e.g., two semiconductor dies, a semiconductor die and a substrate (e.g., a package substrate), etc.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 2A-6. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
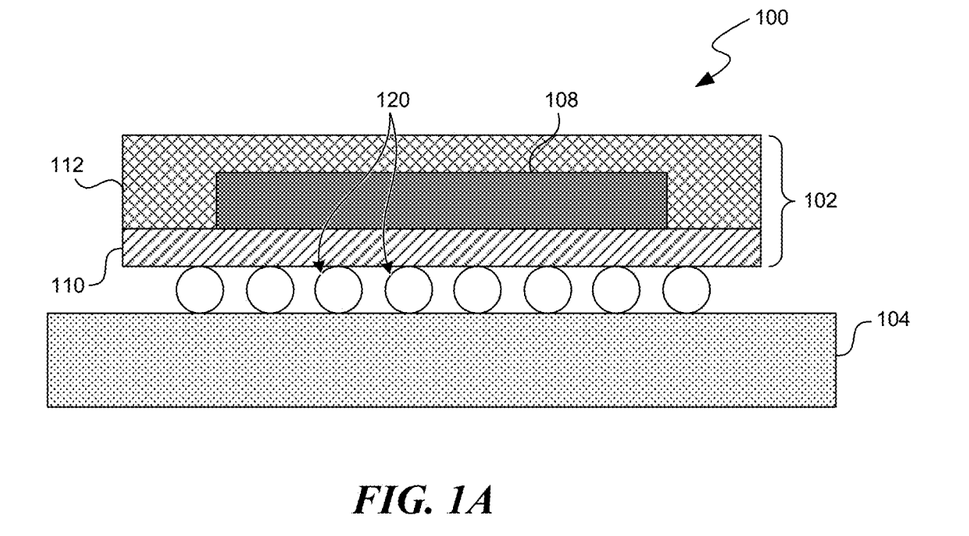
FIG. 1A is a side cross-sectional view of a semiconductor assembly.

FIG. 1A is a side cross-sectional view of a semiconductor assembly 100 ("assembly 100"). The assembly 100 includes a semiconductor package 102 coupled to a PCB 104 via an array of connectors 120 (e.g., a solder BGA). The semiconductor package 102 includes a semiconductor die 108 mounted on a package substrate 110 and encapsulated by a mold material 112.

Figure 1B:
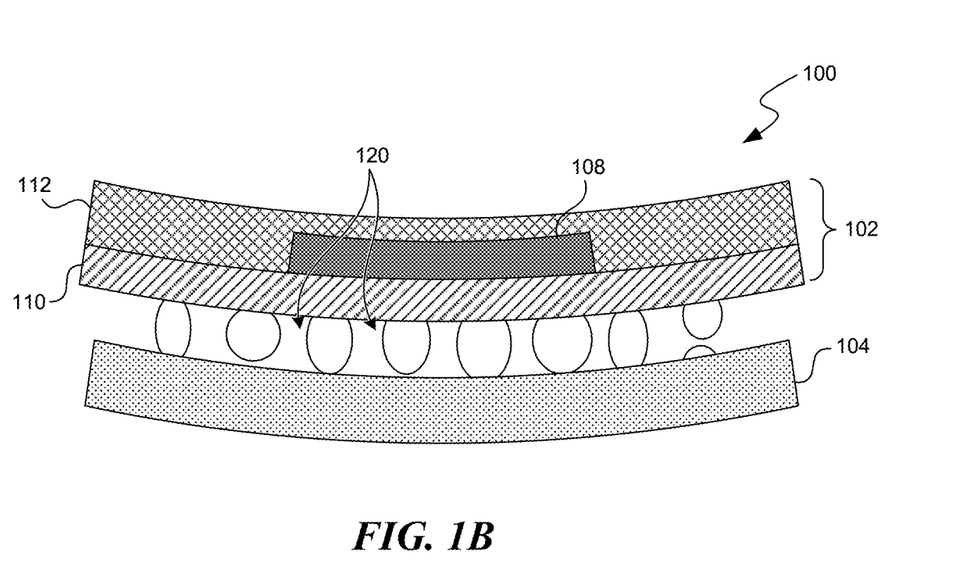
FIG. 1B is a side cross-sectional view of the semiconductor assembly of FIG. 1A when subjected to thermomechanical stress.

FIG. 1B is a side cross-sectional view of the assembly 100 when subjected to thermomechanical stress, e.g., during manufacturing and/or usage. Thermomechanical stresses may be induced, for example, by the assembly process, by thermal cycling and/or thermal shock during component/board level reliability testing, and/or by temperature and/or power cycling during end-customer usage. In some embodiments, the semiconductor package 102 or a component thereof (e.g., the package substrate 110) has a coefficient of thermal expansion (CTE) that is different than the CTE of the PCB 104, and the CTE mismatch between these components can cause them to deform (e.g., warp, bend) relative to one another during cooling and/or heating of the assembly 100. For example, as shown in FIG. 1B, the semiconductor package 102 and PCB 104 can have a warped, non-planar shape after heating and/or cooling. The relative deformation of the semiconductor package 102 and the PCB 104 can result in thermomechanical loading of the connectors 120 that leads to fatigue and/or creep failures. For example, as shown in FIG. 1B, cracks can form and propagate within the connectors 120. Cracks can also form and propagate at the interface between the connectors 120 and the semiconductor package 102 or the PCB 104. Once the crack length reaches a critical value, the electrical coupling between the package 102 and the PCB 104 can be disrupted, rendering the assembly 100 fully or partially inoperable. This process can be accelerated under conditions where the assembly 100 is subject to cyclic loading and/or extreme temperature fluctuations (e.g., in automotive applications).

Figure 2A:
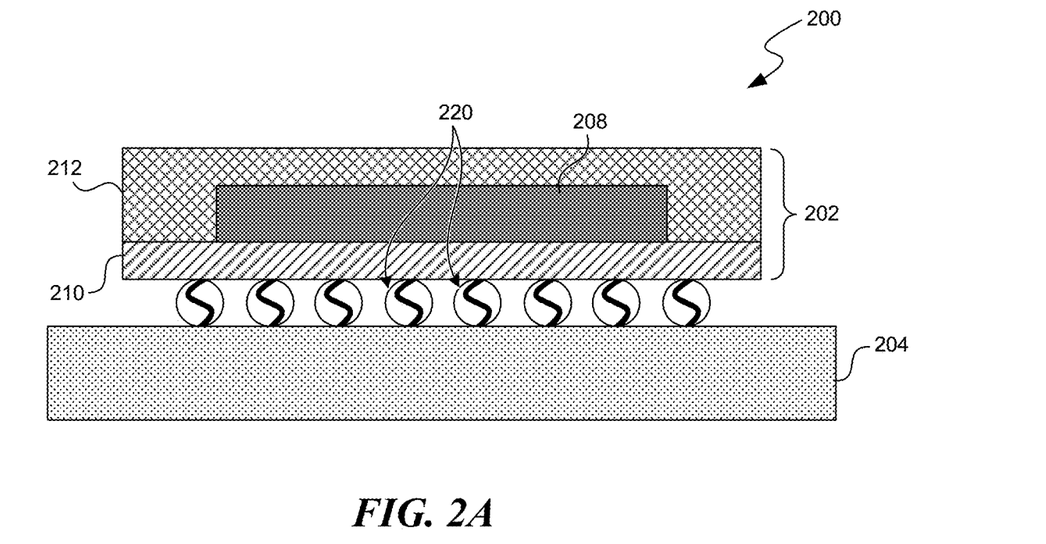
FIG. 2A is as side cross-sectional view of a semiconductor assembly including an array of flexible connectors configured in accordance with embodiments of the present technology.
Figure 2B:
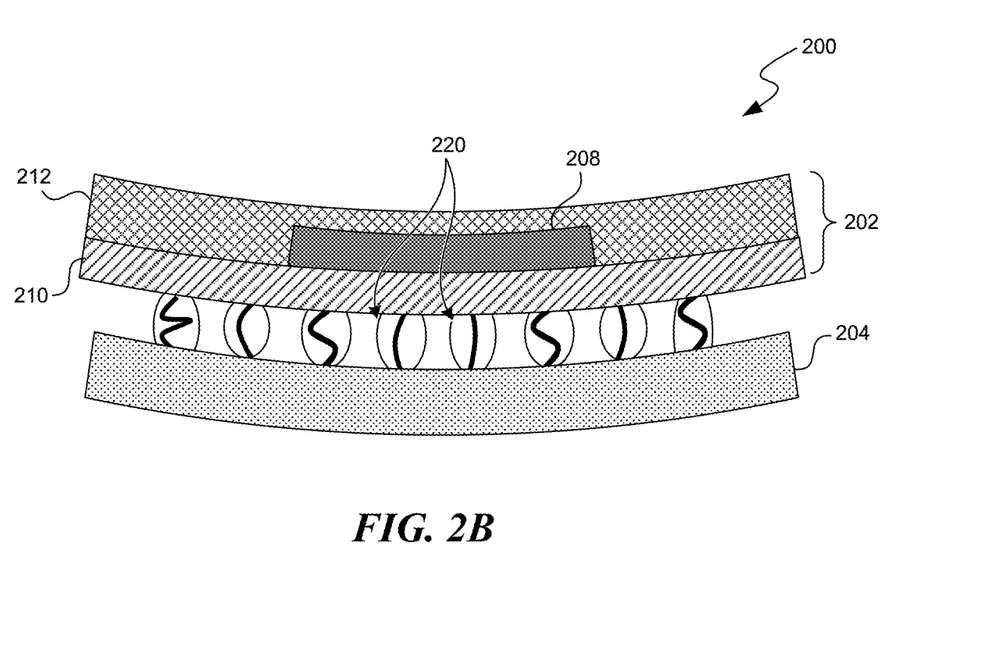
FIG. 2B is a side cross-sectional view of the semiconductor assembly of FIG. 2A when subjected to thermomechanical stress.

FIGS. 2A-2B are side cross-sectional views of a semiconductor assembly 200 including an array of flexible connectors 220 configured in accordance with embodiments of the present technology. The assembly 200 includes a semiconductor package 202 coupled to a PCB 204 via the array of flexible connectors 220. The semiconductor package 202 includes a semiconductor die 208, which can include a semiconductor substrate (e.g., a silicon substrate, a gallium arsenide substrate, an organic laminate substrate, etc.) and various types of semiconductor components and/or functional features, such as memory circuits (e.g., dynamic random-access memory (DRAM), static random-access memory (SRAM), flash memory, or other type of memory circuits), controller circuits (e.g., DRAM controller circuits), logic circuits, processing circuits, circuit elements (e.g., wires, traces, interconnects, transistors, etc.), imaging components, and/or other semiconductor features. Although the illustrated embodiment shows a single semiconductor die 208, in other embodiments the semiconductor package 202 can include multiple semiconductor dies (e.g., two, four, five, six, seven, eight nine, ten, or more dies) arranged in a die stack.

The semiconductor die 208 can be carried by a package substrate 210, which can include a redistribution layer, an interposer, a printed circuit board, a dielectric spacer, another semiconductor die (e.g., a logic die), or another suitable substrate. In some embodiments, the package substrate 210 includes semiconductor components (e.g., doped silicon wafers or gallium arsenide wafers), nonconductive components (e.g., various ceramic substrates, such as aluminum oxide (Al2O3), etc.), aluminum nitride, and/or conductive portions (e.g., interconnecting circuitry, through-silicon vias (TSVs), etc.). The package substrate 210 can be electrically coupled to the semiconductor die 208 via a plurality of interconnectors (e.g., bumps, micro-bumps, pillars, columns, studs, etc.—not shown).

The semiconductor package 202 can further include a mold material 212 formed over the package substrate 210 and/or at least partially around the semiconductor die 208. The mold material 212 can be a resin, epoxy resin, silicone-based material, polyimide, or any other material suitable for encapsulating the semiconductor die 208 and/or at least a portion of the package substrate 210 to protect these components from contaminants and/or physical damage. In some embodiments, the semiconductor package 202 includes other components such as external heatsinks, a casing (e.g., thermally conductive casing), electromagnetic interference (EMI) shielding components, etc.

The semiconductor package 202 can be electrically coupled to the PCB 204 via the array of flexible connectors 220 (e.g., solder balls, conductive bumps, conductive pillars, conductive epoxies, and/or other suitable electrically conductive elements). Each flexible connector 220 can electrically couple the package substrate 210 to the PCB 204, e.g., via respective bond pads on the surfaces of these components (not shown). As a result, the semiconductor die 208 can be electrically coupled to the PCB 204 via the package substrate 210 and flexible connectors 220. Optionally, the flexible connectors 220 can be surrounded by an underfill material (not shown).

The flexible connectors 220 are configured to mitigate the effects of thermomechanical stress and reduce the likelihood of failure of the assembly 200. For example, the flexible connectors 220 can be more compliant compared to conventional materials for connecting the semiconductor package 202 and PCB 204 (e.g., solid metal structures such as solder balls). As a result, when the assembly 200 is subjected to thermomechanical loading (e.g., as shown in FIG. 2B), the flexible connectors 220 can deform (e.g., elastically and/or plastically deform) or otherwise change in geometry to dissipate stresses that would otherwise lead to cracking or other failure modes. In some embodiments, the flexible connectors 220 are configured to elastically deform when the assembly 200 is subjected to thermomechanical loading, with little or no plastic deformation. The flexible connectors 220 can each have a target length range based on the gap distance between the package 202 and the PCB 204, and in operation the flexible connectors 220 can compress or extend from the target length range by 5%, 10%, 15%, 20%, 25%, 30%, 34%, 40%, 45%, 50%, 55%, 60%, 65%, 70%, 75% and/or anything from 5% to 75% and remain fully operational. Optionally, the flexible connectors 220 can be surrounded by an underfill material (not shown), which can provide further cushioning to dissipate applied stresses and/or increase the mechanical strength of the assembly 200.

In some embodiments, each flexible connector 220 of the array is configured to transform between a resting configuration and at least one loaded configuration without mechanical failure (e.g., cracking, fracturing, creep, fatigue, etc.). The resting configuration can be a configuration in which the flexible connector 220 and/or assembly 200 is subjected to little or no thermomechanical loading (e.g., as shown in FIG. 2A). For example, the flexible connector 220 can be in the resting configuration before operation of the assembly 200 (e.g., before thermal and/or power cycling). The loaded configuration(s) can include any configuration(s) in which the flexible connector 220 and/or assembly 200 is subjected to thermomechanical loading (e.g., as shown in FIG. 2B), such as a stretched configuration and/or a compressed configuration. For example, the flexible connector 220 can be in a loaded configuration during or after operation of the assembly 200 (e.g., during or after thermal and/or power cycling) and/or in ambient environments with low (e.g., below −20° C.) or high (e.g., above 40° C.) temperatures. The ability of the flexible connectors 220 to transform between different configurations without mechanical failure can increase robustness and reliability of the assembly 200, e.g., even under cyclic loading and/or harsh operating conditions.

Optionally, when the assembly 200 is subjected to thermomechanical loading, flexible connectors 220 at different portions of the assembly 200 can be subjected to different loads and can therefore be in different configurations. For example, some flexible connectors 220 can be in a loaded configuration (e.g., a stretched or compressed configuration), while other flexible connectors 220 can be in a resting configuration. As another example, flexible connectors 220 at or near the edges of the assembly 200 can be in a stretched configuration, while flexible connectors 220 at or near the internal portions of the assembly 200 can be a compressed configuration.

Figure 3A:
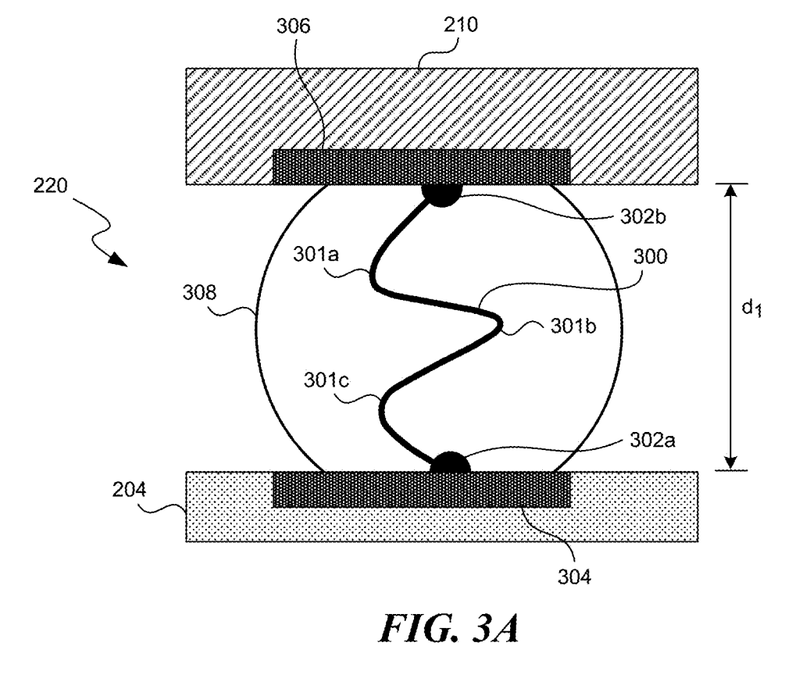
FIG. 3A is a side cross-sectional view of a flexible connector of the assembly of FIG. 2A in a resting configuration.
Figure 3B:
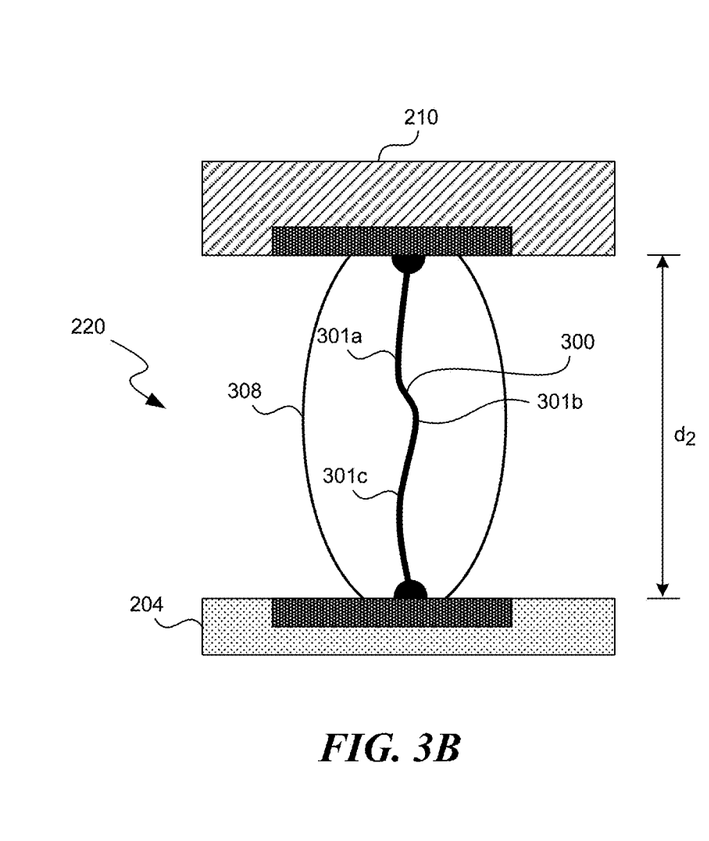
FIG. 3B is a side cross-sectional view of the flexible connector of FIG. 3A in a stretched configuration.
Figure 3C:
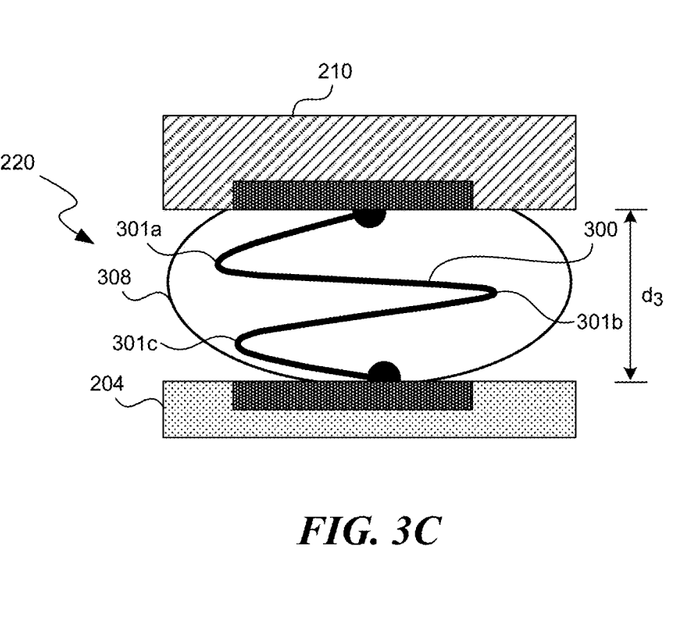
FIG. 3C is a side cross-sectional view of the flexible connector of FIG. 3A in a compressed configuration.

FIGS. 3A-3C are side cross-sectional views of a flexible connector 220 of FIGS. 2A and 2B in accordance with embodiments of the present technology. More specifically, FIG. 3A illustrates the flexible connector 220 in a resting configuration, FIG. 3B illustrates the flexible connector 220 in a stretched configuration (e.g., under tension), and FIG. 3C illustrates the flexible connector 220 in a compressed configuration (e.g., under compression).

Referring first to FIG. 3A, the flexible connector 220 includes a conductive element 300 configured to electrically couple the package substrate 210 and the PCB 204. The conductive element 300 can be an elongated structure such as a wire, filament, tape, coil, etc. The conductive element 300 can be made of any suitable electrically conductive material, such as copper, nickel, gold, silicon, tungsten, conductive epoxy, or combinations thereof. For example, in some embodiments, the conductive element 300 is a conductive metal wire, such as a gold or copper wire. The conductive element 300 can be sufficiently flexible to change in shape while maintaining electrical connectivity between the PCB 204 and package substrate 210, as described in greater detail below.

In some embodiments, the conductive element 300 includes a first end portion 302a coupled to the PCB 204 (e.g., to a bond pad 304) and a second end portion 302b coupled to the package substrate 210 (e.g., to a bond pad 306). As shown in FIG. 3A, when the flexible connector 220 is in the resting configuration, the length of the conductive element 300 between the first and second end portions 302a-b is greater than the separation or gap distance $d_1$ between the PCB 204 and the package substrate 210. For example, the length of the conductive element can be at least 10%, 20%, 30%, 40%, 50%, 60%, 70%, 80%, 90%, or 100% greater than distance $d_1$. As a result, in the resting configuration, the conductive element 300 can have a curved shape (e.g., a bent, folded, spiral, helical, serpentine, zig-zag shape, or otherwise non-linear shape). The curvature of the conductive element 300 can allow the conductive element 300 to change in shape (e.g., expand and/or contract) in response to thermomechanical loading, as described in greater detail below. For example, in the illustrated embodiment, the conductive element 300 has a serpentine shape with three apices 301a-c between the first and second end portions 302a-b. As shown in FIG. 3A, the apices 301a-c can each have a rounded shape and can extend laterally outwards relative to the central longitudinal axis of the flexible connector 220. Although the illustrated embodiment includes three apices 301a-c, in other embodiments the conductive element 300 can include fewer or more apices (e.g., one, two, four, five, six, seven, eight nine, ten, or more apices). Additional geometries suitable for the conductive element 300 are described further below.

The flexible connector 220 can further include a support material 308 partially or completely surrounding the conductive element 300 to provide mechanical support thereto. In the illustrated embodiment, for example, the conductive element 300 is embedded and/or encapsulated in the support material 308. The support material 308 can be coupled to the bond pads 304 and 306, and in some cases to the surfaces of the package substrate 210 and/or the PCB 204. In some embodiments, the support material 308 is a relatively soft and/or compliant material (e.g., a polymer or a resin) configured to deform (e.g., elastically and/or plastically, by stretching and/or compressing) when a thermomechanical load is applied, as described in greater detail below. The support material 308 can be a curable material (e.g., an epoxy resin) that is curable by application of energy (e.g., heat and/or light) from a liquid state into a solid or semi-solid state. Optionally, the support material 308 can be electrically non-conductive so as to reduce or avoid electrical interference (e.g., with neighboring flexible connectors 220).

The support material 308 can be configured in many different ways. For example, the support material 308 can have any suitable shape, such as a ball, bump, spherical, ellipsoidal, or cylindrical shape. In some embodiments, the support material 308 has a uniform cross-sectional size (e.g., area, diameter, width, etc.). In other embodiments different portions of the support material 308 can have different cross-sectional sizes. The cross-sectional size of the support material 308 can be greater than the cross-sectional size of the conductive element 308. For example, the cross-sectional size of the support material 308 (e.g., minimum, maximum, and/or average cross-sectional size) can be at least 2, 5, 20, 25, 30, 40, or 50 times greater than the cross-sectional size of the conductive element 308.

Referring next to FIG. 3B, in some embodiments, when subjected to tensile thermomechanical loading, the PCB 204 and package substrate 210 can warp, bend, or otherwise move apart from each other to an increased separation or gap distance $d_2$. The increased separation distance $d_2$ can be at least 10%, 20%, 30%, 40%, 50%, 60%, 70%, 80%, 90%, or 100% greater than the initial separation distance $d_1$. As a result, the flexible connector 220 transforms into a stretched configuration under tension (e.g., as shown in FIG. 3B). The conductive element 300 can also change in shape to a linear, generally linear, and/or less curved shape having a decreased amount of curvature compared to the resting configuration.

For example, in the illustrated embodiment, the conductive element 300 has a generally linear shape in which the apices 301a-c have moved vertically apart from each other and/or laterally inwards towards the central longitudinal axis of the flexible connector 220. Similarly, the support material 308 can also transform into an elongated shape with a decreased cross-sectional size (e.g., area, diameter, width) compared to the resting configuration. For example, the cross-sectional size of the support material 308 (e.g., minimum, maximum, and/or average cross-sectional size) in the stretched configuration can be no more than 10%, 20%, 30%, 40%, 50%, 60%, 70%, 80%, or 90% of the cross-sectional size of the support material 308 in the resting configuration. The shape change of the conductive element 300 and/or the support material 308 can be based primarily or entirely on elastic deformation, with little or no plastic deformation.

Referring next to FIG. 3C, in other embodiments, when subjected to compressive thermomechanical loading, the PCB 204 and package substrate 210 can warp, bend, or otherwise move towards each other to a decreased separation or gap distance $d_3$. The decreased separation distance $d_3$ can be no more than 10%, 20%, 30%, 40%, 50%, 60%, 70%, 80%, or 90% of the initial separation distance $d_1$. As a result, the flexible connector 220 transforms into a compressed configuration (e.g., as shown in FIG. 3C). The conductive element 300 can also transform into a more curved shape having a greater amount of curvature compared to the resting configuration. For example, in the illustrated embodiment, the conductive element 300 has transformed into a more curved serpentine shape in which the apices 301a-c have moved vertically towards each other and/or laterally outwards away from the central longitudinal axis of the flexible connector 220. Similarly, the support material 308 can also transform into a shortened shape with an increased cross-sectional size (e.g., area, diameter, width) compared to the resting configuration. For example, the cross-sectional size of the support material 308 (e.g., minimum, maximum, and/or average cross-sectional size) in the stretched configuration can be at least 10%, 20%, 30%, 40%, 50%, 60%, 70%, 80%, 90%, or 100% greater than of the cross-sectional size of the support material 308 in the resting configuration. The shape change of the conductive element 300 and/or the support material 308 can be based primarily or entirely on elastic deformation, with little or no plastic deformation.

FIGS. 4A-4D are side-cross sectional views of flexible connectors 220 in accordance with further embodiments of the present technology for electrically coupling the package substrate 210 to the PCB 204. The features of the embodiments of FIGS. 4A-4D can be combined with each other and/or with any of the other embodiments described herein (e.g., the embodiments of FIGS. 3A-3C). Additionally, any of the embodiments of FIGS. 4A-4D can be implemented as part of a semiconductor assembly (e.g., the assembly 200 of FIGS. 2A-2B).

Figure 4A:
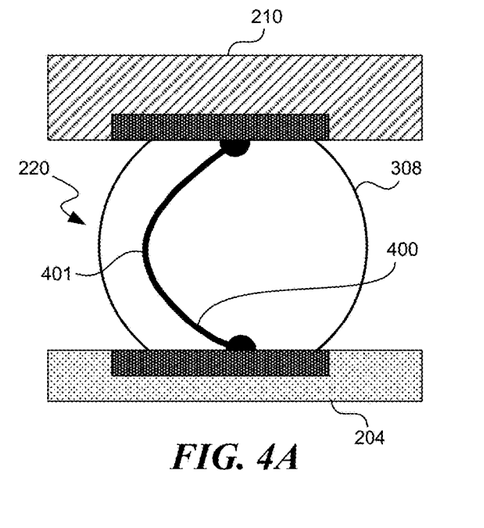
FIGS. 4A-4D are side cross-sectional views of flexible connectors configured in accordance with further embodiments of the present technology.

FIG. 4A illustrates a flexible connector 220 with a conductive element 400. The conductive element 400 can be generally similar to the conductive element 300 described with respect to FIGS. 3A-3C, except that the conductive element 400 has a single apex 401 rather than multiple apices. The apex 401 can extend laterally outwards from the central longitudinal axis of the flexible connector 220 so that the conductive element 400 is curved. The curvature of the apex 401 can increase or decrease as the flexible connector 220 compresses or stretches, respectively. Although the apex 401 is shown in FIG. 4A as having a rounded shape, in other embodiments the apex 401 can have a pointed or sharpened shape.

Figure 4B:
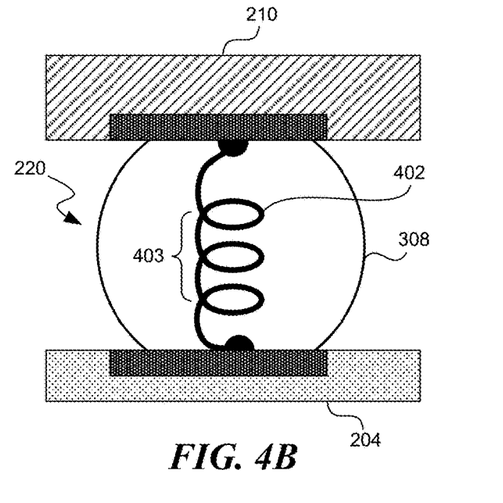

FIG. 4B illustrates a flexible connector 220 with a conductive element 402 having a helical or spiral shape. The conductive element 402 can include a plurality of coils 403 arranged vertically along the central longitudinal axis of the flexible connector 220. The coils 403 can move vertically towards each other or away from each other as the flexible connector 220 compresses or stretches, respectively. Alternatively or in combination, the coil size can increase or decrease as the flexible connector 220 compresses or stretches, respectively. Although the embodiment of FIG. 4B includes three coils 403, in other embodiments the conductive element 402 can include fewer or more coils (e.g., one, two, four, five, six, seven, eight nine, ten, or more coils).

Figure 4C:
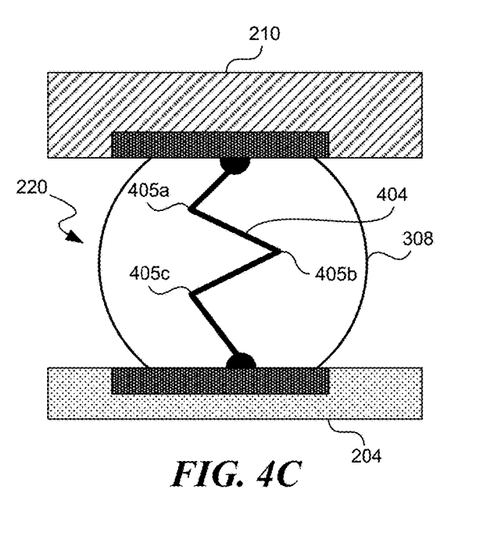

FIG. 4C illustrates a flexible connector 220 with a conductive element 404 having a folded or zig-zag shape. The conductive element 404 can be generally similar to the conductive element 300 described with respect to FIGS. 3A-3C, except that the conductive element 404 is composed of linear segments rather than curved segments, and the apices 405a-c have a pointed shape rather than a rounded shape. The apices 405a-c can move laterally outwards and/or vertically together as the flexible connector 220 is compressed, and can move laterally inwards and/or vertically apart as the flexible connector 220 is stretched. Although the embodiment of FIG. 4C includes three apices 405a-c, in other embodiments the conductive element 404 can include fewer or more apices (e.g., one, two, four, five, six, seven, eight nine, ten, or more apices).

Figure 4D:
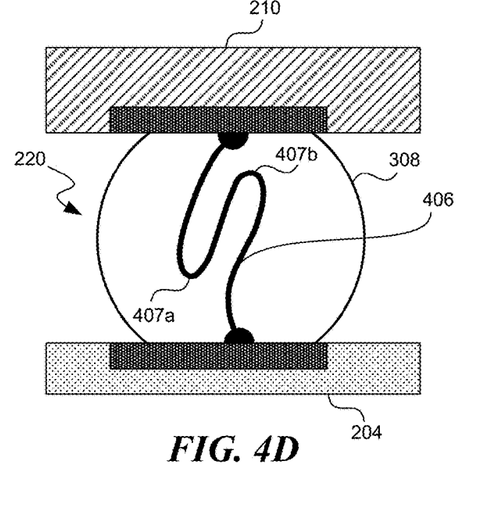

FIG. 4D illustrates a flexible connector 220 with a conductive element 406 having a serpentine shape with a plurality of apices 407a-b. The conductive element 406 can be generally similar to the conductive element 300 described with respect to FIGS. 3A-3C, except that the apices 407a-b are oriented in a vertical or generally vertical direction rather than laterally. The apices 407a-b can move vertically towards each other as the flexible connector 220 is stretched, and can move vertically away from each other as the flexible connector 220 is compressed. Although the embodiment of FIG. 4D includes two apices 407a-b, in other embodiments the conductive element 406 can include fewer or more apices (e.g., one, three, four, five, six, seven, eight nine, ten, or more apices). Additionally, in other embodiments the apices 407a-b can have a pointed shape rather than a rounded shape.

FIGS. 5A-5F illustrate various stages of a method for manufacturing a semiconductor assembly having a flexible connector array configured in accordance with embodiments of the present technology. The method can be used to manufacture any embodiment of the semiconductor assemblies and flexible connectors described herein, such as the embodiments of FIGS. 2A-2B, 3A-3C, and 4A-4D.

Figure 5A:
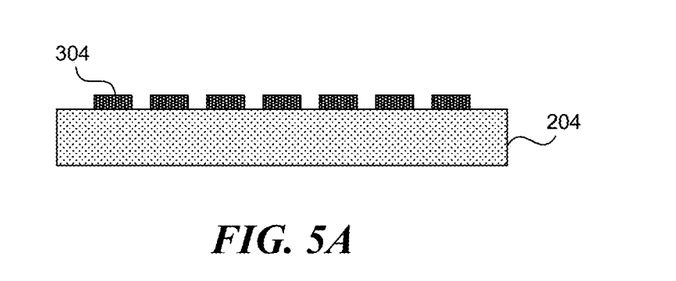
FIGS. 5A-5F illustrate various stages of a method for manufacturing a semiconductor assembly including a flexible connector array configured in accordance with embodiments of the present technology.

Referring first to FIG. 5A, a PCB 204 with a plurality of bond pads 304 (e.g., copper bond pads) is provided. The bond pads 304 can be formed in an array or other patterned arrangement, as is known to those of skill in the art.

Figure 5B:
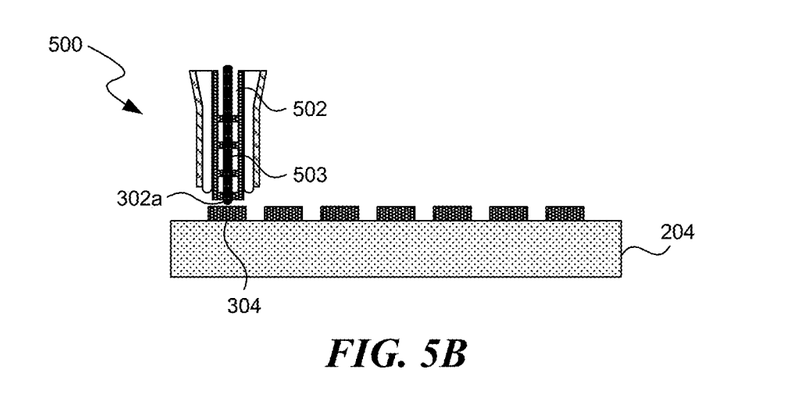

Referring next to FIG. 5B, a first end portion 302a of a conductive element (e.g., a conductive wire) is formed and electrically coupled to a bond pad 304 on the PCB 204, e.g., using wire bonding or another suitable process. In some embodiments, the coupling is performed using a manufacturing device having a nozzle 500 configured for forming a wire-bond type conductive element on the bond pad 304 as is known to those of skill in the art. The nozzle 500 can include an inner lumen 502 through which a conductive material 503 flows to form the conductive element.

Figure 5C:
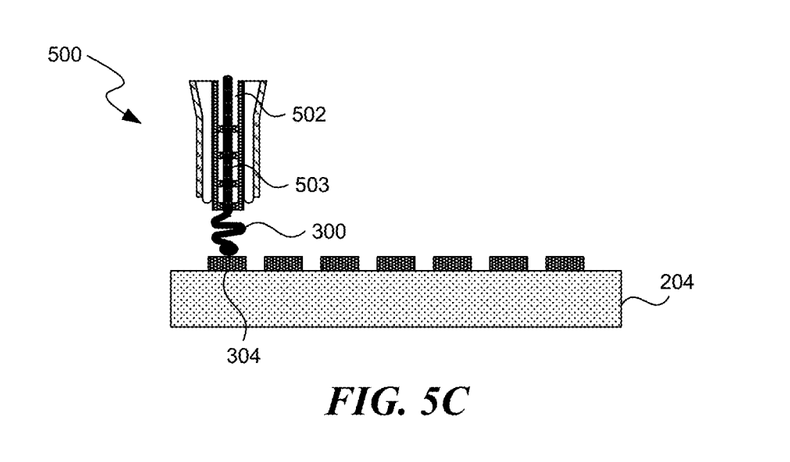

Referring next to FIG. 5C, a conductive element 300 with at least one curve (e.g., bend, spiral, helix, fold, etc.) is formed as the conductive material 503 exits the lumen 502 and cools. In some embodiments, the curve(s) are formed by moving the nozzle 500 in a predetermined trajectory as the conductive material 503 flows from the inner lumen 502. For example, the nozzle 500 can be moved along a trajectory having an identical or similar shape as the desired shape of the conductive element 300 (e.g., any of the shapes described herein with respect to FIGS. 3A-3C and 4A-4D). Alternatively or in combination, the nozzle 500 can be moved vertically upwards to a predetermined height to form a straight column of conductive material 503 with a desired length, then moved vertically downwards so that the conductive material 503 bends, folds, or otherwise assumes a curved shape to form the conductive element 300.

Figure 5D:
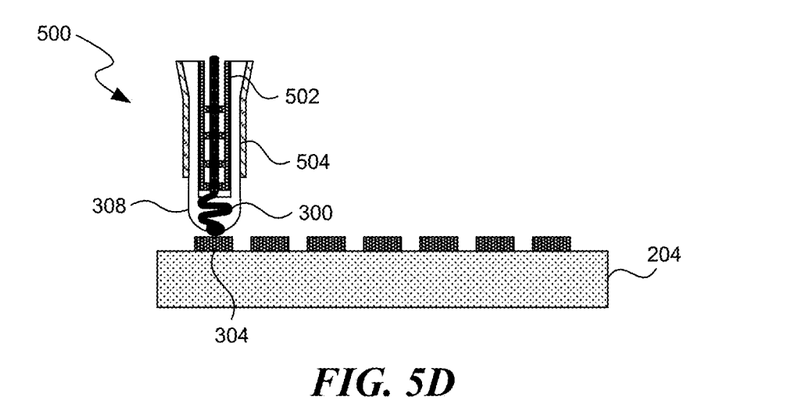

Referring next to FIG. 5D, the conductive element 300 is at least partially surrounded with a support material 308. The support material 308 can be delivered from the nozzle 500, e.g., from an outer lumen 504 surrounding the inner lumen 502. In other embodiments, the support material 308 can be delivered from a separate device. Optionally, the support material 308 can be delivered in a liquid and/or uncured form with a viscosity configured such that the support material 308 can be ejected from the nozzle 500 to surround the conductive element 300 without flowing or encroaching onto other portions of the PCB 204. The support material 308 can be solidified and/or cured (e.g., with heat, light) concurrently with or after delivery of the support material 308 from the nozzle 500. In other embodiments, the support material 308 is solidified and/or cured at a later stage in the manufacturing process, as described below.

Figure 5E:
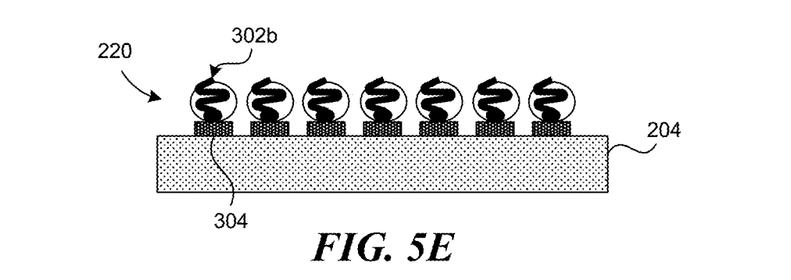

Referring next to FIG. 5E, the nozzle 500 is separated from the conductive element 300, leaving a second end portion 302b of the conductive element 300 exposed. The process described with respect to FIGS. 5B-5D can then repeated to form an array of flexible connectors 220. In some embodiments, a single nozzle is used to sequentially form each flexible connector 220. Alternatively, an array of nozzles can be used to form multiple flexible connectors 220 concurrently.

Figure 5F:
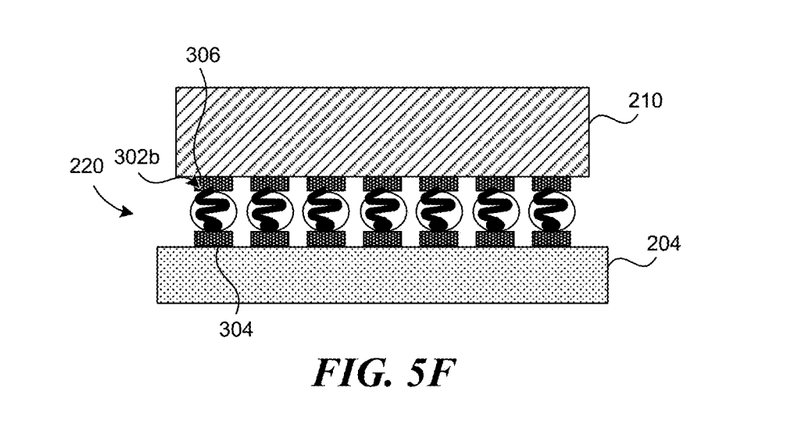

Referring next to FIG. 5F, the second end portion 302b of each conductive element 300 is electrically coupled to a package substrate 210 (e.g., via bond pads 306). The package substrate 210 can be part of a semiconductor package (not shown) such that the conductive element 300 electrically couples the PCB 204 to the semiconductor package as previously described. In some embodiments, the package substrate 210 includes a plurality of bond pads 306 formed in an array or other patterned arrangement, and the bond pads 306 are aligned and brought into contact with the flexible connectors 220 and/or the second end portions 302b. The bond pads 306 can then be bonded or otherwise coupled to the flexible connectors 220 and/or second end portions 302b in accordance with methods known to those of skill in the art. For example, in embodiments where the support material 308 is in a liquid and/or uncured form, the support material 308 can also be solidified and/or cured to mechanically couple the package substrate 210 to the flexible connectors 220 and/or the PCB 204.

The method described with respect to FIGS. 5A-5F can be implemented in a number of different ways. For example, the support material 308 can be delivered onto the PCB 204 before the conductive element 300. In such embodiments, the conductive element 300 can be subsequently pushed through the support material 308 to contact and couple to the PCB 204. As another example, the array of flexible connectors 220 can be formed on the package substrate 210 rather than the PCB 204. In yet another example, the array of flexible connectors can be formed on a separate fabrication substrate, then subsequently separated from the fabrication substrate and coupled between the package substrate 210 and PCB 204.

Figure 6:
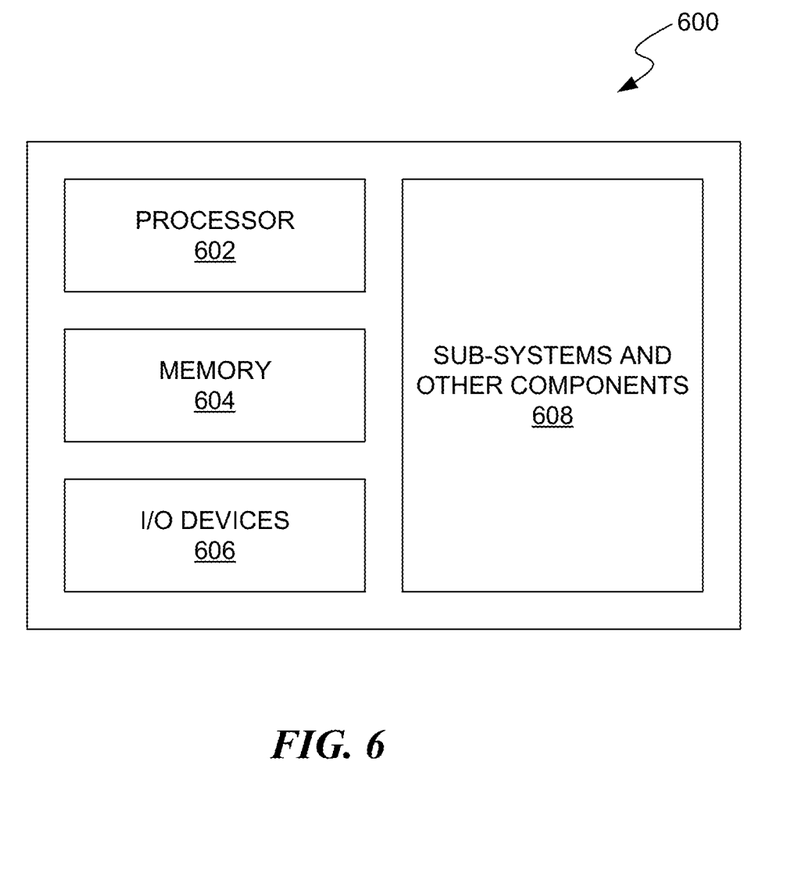
FIG. 6 is a schematic view of a system that includes a semiconductor device or package configured in accordance with embodiments of the present technology.

Any one of the semiconductor devices and/or packages having the features described above with reference to FIGS. 2A-5F can be incorporated into any of a myriad of larger and/or more complex systems, a representative example of which is system 600 shown schematically in FIG. 6. The system 600 can include a processor 602, a memory 604 (e.g., SRAM, DRAM, flash, and/or other memory devices), input/output devices 606, and/or other subsystems or components 608. The semiconductor dies and/or packages described above with reference to FIGS. 2A-5F can be included in any of the elements shown in FIG. 6. The resulting system 600 can be configured to perform any of a wide variety of suitable computing, processing, storage, sensing, imaging, and/or other functions. Accordingly, representative examples of the system 600 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 600 include lights, cameras, vehicles, etc. With regard to these and other example, the system 600 can be housed in a single unit or distributed over multiple interconnected units, e.g., through a communication network. The components of the system 600 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:
1. A semiconductor assembly, comprising:
a substrate; and
an array of flexible connectors coupled to the substrate, each flexible connector transformable between a resting configuration and a loaded configuration, wherein each flexible connector includes—
a conductive wire electrically coupled to the substrate, the conductive wire having a first shape when the flexible connector is in the resting configuration and a second shape when the flexible connector is in the loaded configuration, the second shape differing from the first shape, wherein the first shape is a first serpentine shape including a plurality of apices spaced laterally from a central longitudinal axis of the flexible connector at a plurality of first distances, respectively, and wherein the second shape is a second serpentine shape including the plurality of apices spaced laterally from the central longitudinal axis at a plurality of second distances, respectively, the plurality of second distances different than the plurality of first distances, and a support material at least partially surrounding the conductive wire.

2. The semiconductor assembly of claim 1 wherein:

the loaded configuration is a compressed configuration and the second shape has a greater amount of curvature than the first shape, or the loaded configuration is a stretched configuration and the second shape has a smaller amount of curvature than the first shape.

3. The semiconductor assembly of claim 1 wherein:

each flexible connector is transformable between the resting configuration and a second loaded configuration, and the conductive wire has a third shape when the flexible connector is in the second loaded configuration, the third shape differing from the first and second shapes.

4. The semiconductor assembly of claim 1 wherein the support material is configured to elastically deform as the flexible connector transforms between the resting configuration and the loaded configuration.

5. The semiconductor assembly of claim 1 wherein the support material comprises a polymer.

6. The semiconductor assembly of claim 1 wherein each flexible connector has a target length range based on a gap distance between the substrate and a printed circuit board coupled to the substrate via the array of flexible connectors, and wherein in operation each flexible connector can compress or extend from the target length range by 5%-75% and remain fully operational.

7. A method of manufacturing a semiconductor assembly, the method comprising:

electrically coupling a first end portion of a conductive wire to a printed circuit board;

surrounding at least a portion of the conductive wire with a support material to form a flexible connector; and electrically coupling a second end portion of the conductive wire to a substrate, wherein a length of the conductive wire between the first and second end portions is greater than a distance between the printed circuit board and the substrate, and wherein the conductive wire has a first serpentine shape when the flexible connector is in a resting configuration and a second serpentine shape when the flexible connector is in the loaded configuration, wherein the first serpentine shape includes a plurality of apices spaced laterally from a central longitudinal axis of the flexible connector at a plurality of first distances, respectively, and wherein the second serpentine shape includes the plurality of apices spaced laterally from the central longitudinal axis at a plurality of second distances, respectively, the plurality of second distances different than the plurality of first distances.

8. The method of claim 7 wherein the first end portion is electrically coupled to the printed circuit board by wire bonding.

9. The method of claim 7, further comprising forming at least one curve, bend, spiral, helix, or fold in the conductive wire between the first and second end portions.

10. The method of claim 7 wherein the support material comprises a curable material, and wherein the method further comprises curing the curable material.

11. The method of claim 10 wherein the curable material is cured with heat or light.

12. The method of claim 10 wherein the curable material is cured after surrounding at least the portion of the conductive wire with the curable material.

13. The method of claim 7, further comprising delivering the conductive wire and the support material from a nozzle of a manufacturing device.

14. The method of claim 13, further comprising moving the nozzle along a predetermined trajectory as the conductive wire is delivered therefrom so as to form at least one curve, bend, spiral, helix, or fold in the conductive wire.

15. The method of claim 13 wherein the conductive wire is delivered from an inner lumen of the nozzle and the support material is delivered from an outer lumen of the nozzle.

16. The method of claim 13 wherein the conductive wire is delivered from the nozzle before the support material is delivered from the nozzle.

17. The semiconductor assembly of claim 1, wherein the supporting material forms a spherical or ellipsoidal shape.

18. The semiconductor assembly of claim 1, wherein the supporting material has a loaded maximum cross-sectional area when the flexible connector is in the loaded configuration and a resting maximum cross-sectional area when the flexible connector is in the resting configuration, and wherein the loaded maximum cross-sectional area differs from the resting maximum cross-sectional area by at least 10% of the value of the resting maximum cross-sectional area.

19. The semiconductor assembly of claim 1, wherein a maximum cross-sectional width of the supporting material is at least 25 times greater than a cross-sectional width of the conductive wire.

20. The semiconductor assembly of claim 1, wherein at least one end portion of the conductive wire has a greater cross-sectional area than a middle portion of the conductive wire.

21. The semiconductor assembly of claim 1, wherein the first shape and the second shape include three or fewer apices.

22. The semiconductor assembly of claim 1, wherein the plurality of apices lie in a same vertical plane.

* * * * *